United States Patent [19]

Meyer

[11] 4,012,599
[45] Mar. 15, 1977

[54] TELEPHONE COMMUNICATIONS SYSTEM FOR THE DEAF

[76] Inventor: Jerome Charles Meyer, 1512 Ben Roe Ave., Los Altos, Calif. 94022

[22] Filed: July 29, 1975

[21] Appl. No.: 600,155

[52] U.S. Cl. .................. 179/84 VF; 179/2 DP
[51] Int. Cl.$^2$ .......................... H04M 11/06
[58] Field of Search .......... 179/84 VF, 84 L, 81 C, 179/2 DP, 2 TV, 2 R, 2 A

[56] References Cited

UNITED STATES PATENTS

| | | | |
|---|---|---|---|
| 3,573,376 | 4/1971 | Bartlett | 179/2 DP |
| 3,652,795 | 3/1972 | Wolf | 179/2 DP |
| 3,675,513 | 7/1972 | Flanagan | 179/84 VF |
| 3,746,793 | 7/1973 | Sachs | 179/2 DP |
| 3,778,553 | 12/1973 | Rackman | 179/2 DP |
| 3,870,821 | 3/1975 | Steury | 179/2 DP |

Primary Examiner—Kathleen H. Claffy
Assistant Examiner—Joseph Popek
Attorney, Agent, or Firm—Theodore Scott Park

[57] ABSTRACT

A self-powered, portable, hand-held communicator and system provides a deaf user with a visual display of conversational information transmitted to him with a standard pushbutton telephone. A highly efficient and easily remembered encoding scheme is featured wherein the alphabetic character encoding utilizes the standard markings on the telephone pushbuttons and the relative positional location of the pushbuttons. Rapid tactile transmission of messages by a user is enhanced and user fatigue minimized by requiring only a single pushbutton stroke per hand to transmit any alphabetic character. User fatigue is additionally minimized by distributing pushbutton actuation requirements for normal conversation among a plurality of the fingers of each hand and by assigning control functions to pushbuttons having positions spatially and visually related to the encoding function they perform and to the user's finger positions during message transmission.

14 Claims, 12 Drawing Figures

FIGURE 1A

|   | ABC 2 | DEF 3 | I |
|---|---|---|---|
| GHI 4 | JKL 5 | MNO 6 | II |
| PRS 7 | TUV 8 | WXY 9 | III |
| * | 0 | # | IV |

FIGURE 1B

| CHARACTER | ACTUATION SEQUENCE |
|---|---|
| A | ✻2 |
| B | 02 |
| C | #2 |
| D | ✻3 |
| E | 03 |
| F | #3 |
| G | ✻4 |
| H | 04 |
| I | #4 |
| J | ✻5 |
| K | 05 |
| L | #5 |
| M | ✻6 |
| N | 06 |
| O | #6 |
| P | ✻7 |
| Q | 01 |
| R | 07 |
| S | #7 |
| T | ✻8 |
| U | 08 |
| V | #8 |
| W | ✻9 |
| X | 09 |
| Y | #9 |
| Z | #1 |
| . | ✻1 |
| = | ✻✻✻1 |
| [ | ✻✻✻2 |
| ] | ✻✻✻3 |
| / | ✻✻✻4 |
| + | ✻✻✻5 |
| / | ✻✻✻6 |
| : | ✻✻✻7 |
| ; | ✻✻✻8 |
| ? | ✻✻✻9 |
| " | ✻✻✻0 |
| 1 | ###1 |
| 2 | ###2 |
| 3 | ###3 |
| 4 | ###4 |
| 5 | ###5 |
| 6 | ###6 |
| 7 | ###7 |
| 8 | ###8 |
| 9 | ###9 |
| 0 | ###0 |

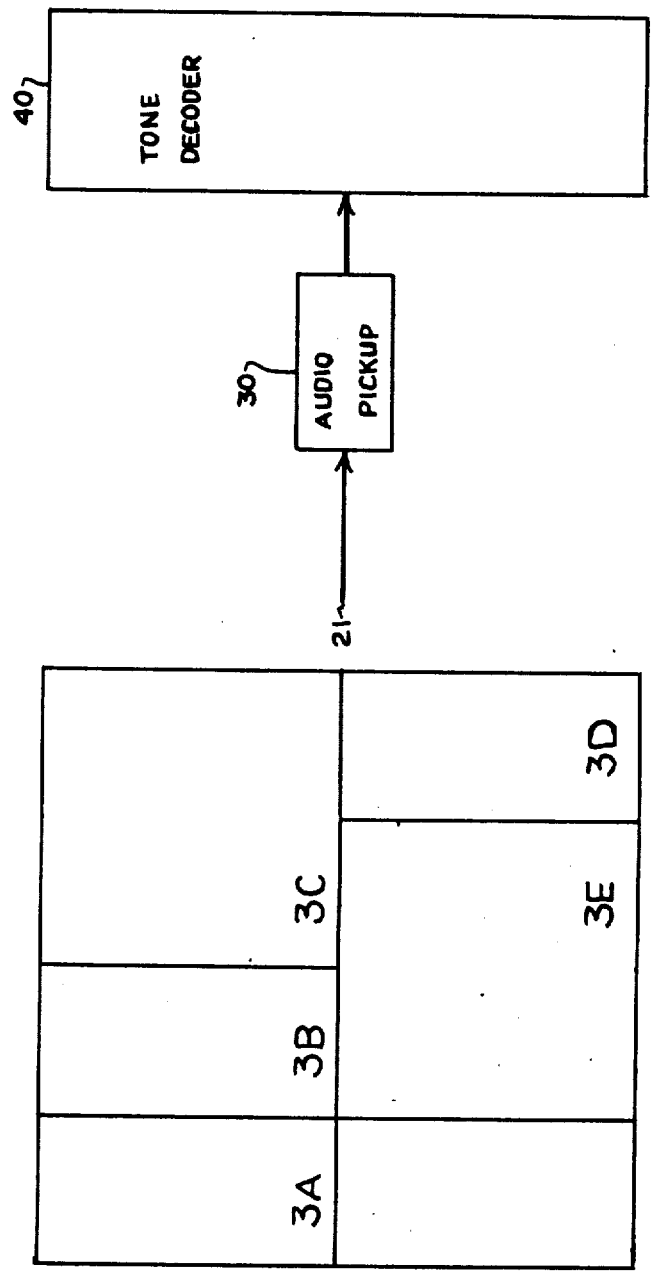

FIGURE 4

| SELECT FUNCTION | PUSHBUTTON ACTUATED | | | ADDRESS BITS | | |
|---|---|---|---|---|---|---|
| | * | O | # | H | J | K |
| LEFT LETTER | 1 | | | 1 | 0 | 0 |
| MIDDLE LETTER | | 1 | | 1 | 1 | 0 |
| RIGHT LETTER | | | 1 | 0 | 1 | 0 |
| NUMBER MODE | | | 3 | 0 | 0 | 0 |
| SYMBOL MODE | 3 | | | 0 | 0 | 1 |

TELEPHONE COMMUNICATIONS SYSTEM FOR THE DEAF

BACKGROUND AND SUMMARY OF THE INVENTION

This invention relates to an apparatus for enabling deaf persons to converse over ordinary pushbutton telephone instruments and more particularly to a communicator and system employing an encoding technique and control key selection designed to minimize user fatigue and to enhance rate of word transmission during a normal conversation between deaf users.

Various systems have been disclosed for communicating data by using the pushbutton telephone set as a communications instrument. Flanagan et al in U.S. Pat. No. 3,675,513 describes a pushbutton telephone-teletypewriter communications system wherein encoded teletypewriter functions can be sent from either a special typewriter or a standard pushbutton telephone over telephone lines to a receiving typewriter for producing a permanent record of information received. Flanagan utilizes an encoding scheme requiring as many as four pushbutton strokes for selection of alphabetic characters. Multiple actuation is required of selected control keys for character selection. Steury in U.S Pat. No. 3,870,821 describes an improvement in pushbutton telephone communications systems of the general type described by Flanagan wherein a code chart display for indicating the particular set of characters, symbols or function signals is required. Selection and transmission of a desired alpha character can require three pushbutton actuations if an alpha portion of an alphanumeric message is transmitted by a device constructed as taught by Steury.

It is an object of this invention to provide an apparatus to deaf users for communicating over standard pushbutton telephones wherein a visual indication of a received or transmitted alphabetic character is provided and transmission of an alphabetic character requires a maximum of only two pushbutton strokes.

It is an object of this invention to provide an apparatus to deaf users so that anyone can communicate to a deaf user over the telephone system using standard pushbutton telephone tones.

Another object of the invention is to lessen user fatigue by providing an encoding scheme in which a user can comfortably use both hands and needs only to stroke a single pushbutton with each hand for selection of any alphabetic character.

Another object of the invention is to provide an easily identified and remembered alphabetic encoding scheme which takes advantage of the customary arrangement of markings on the standard pushbutton telephone keyboard coupled with assignment of control functions which are related to a pushbutton's relative position with respect to other pushbuttons.

Another object is to eliminate the need for an alphabetic code conversion chart.

A further object is to provide a deaf user with the capability of sending numbers and special symbols in selectable special modes where the coding scheme insures against accidental selection of a numeric symbol or other special mode by a user.

Another object is to minimize the number of pushbutton strokes required to send a series of numbers or special symbols once a user is in a numeric or other special mode.

A further object is to provide an inexpensive portable, self-powered and pocketsize communicator to deaf persons.

These and other objects of the invention are accomplished in accordance with the principles of this invention by implementing a coding scheme wherein pushbuttons of a standard pushbutton telephone set are assigned control functions related to their positional order. Preferably, actuation of the left-most lower pushbutton followed by actuation of a pushbutton having alphabetic symbols thereon effects transmission of the left-most indicated alphabetic letter. Actuation of the center lower key followed by actuation of a pushbutton having alphabetic symbols thereon causes transmission of the center indicated alphabetic letter. Similarly, actuation of the lower right pushbutton causes the right-most letter of a subsequently actuated pushbutton to be transmitted.

A user achieves rapid conversation transmission rates by using three fingers of a selected hand to actuate pushbuttons having control functions and the fingers of his other hand to actuate the remaining pushbuttons of the pushbutton telephone. Only one finger of each hand is thereby required for transmission of a selected alphabetic character. Physical effort required for tactile actuation of the pushbuttons is evenly divided between both hands and fatigue is minimized. Tactile effort related to control functions is distributed among a plurality of fingers of a selected hand to additionally lessen user fatigue.

The coding scheme is easily learned and remembered as a result of the positional ordering of control pushbuttons and their positional relation to the visual grouping of alphabetic characters appearing on the remaining pushbuttons.

Additional special transmission modes are provided for transmitting, for example, numbers and special symbols particularly adapted for the deaf, or the like. To ensure against inadvertent transfer from the normal alphabetic mode to a special mode, the code preferably calls for multiple actuation of a selected pushbutton to switch the communicator into a special mode. Once in the special mode, however, the user at his option sends a series of characters or symbols within the same mode by single pushbutton strokes corresponding to a selected character or symbol. User fatigue is thereby minimized and rate of transmission thereby enhanced for the commonly occurring situation in normal conversation wherein, for example, a series of numbers is to be sent. A user actuates a selected pushbutton with a single stroke to return to the normal alphabetic mode.

DESCRIPTION OF THE DRAWING

FIGS. 1A to 1D depict the keyboards of standard 12 and 16 pushbutton telephones and a preferred coding scheme in accordance with the invention for use therewith.

FIG. 4 is a table summarizing the operations of control logic within the preferred embodiment.

DESCRIPTION OF THE PREFERRED EMBODIMENT

Figures 1C, 1D:
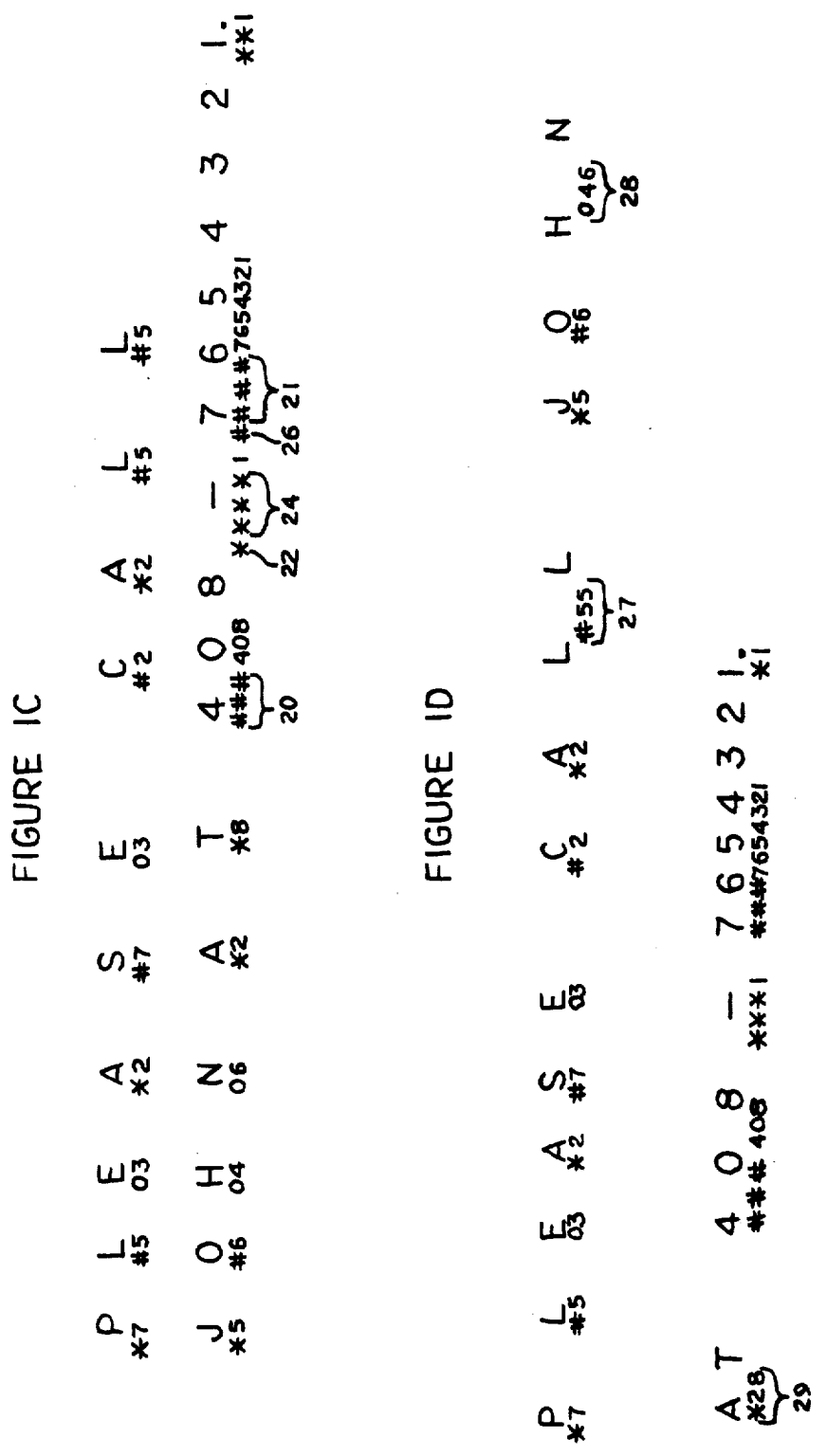
Figure 2:
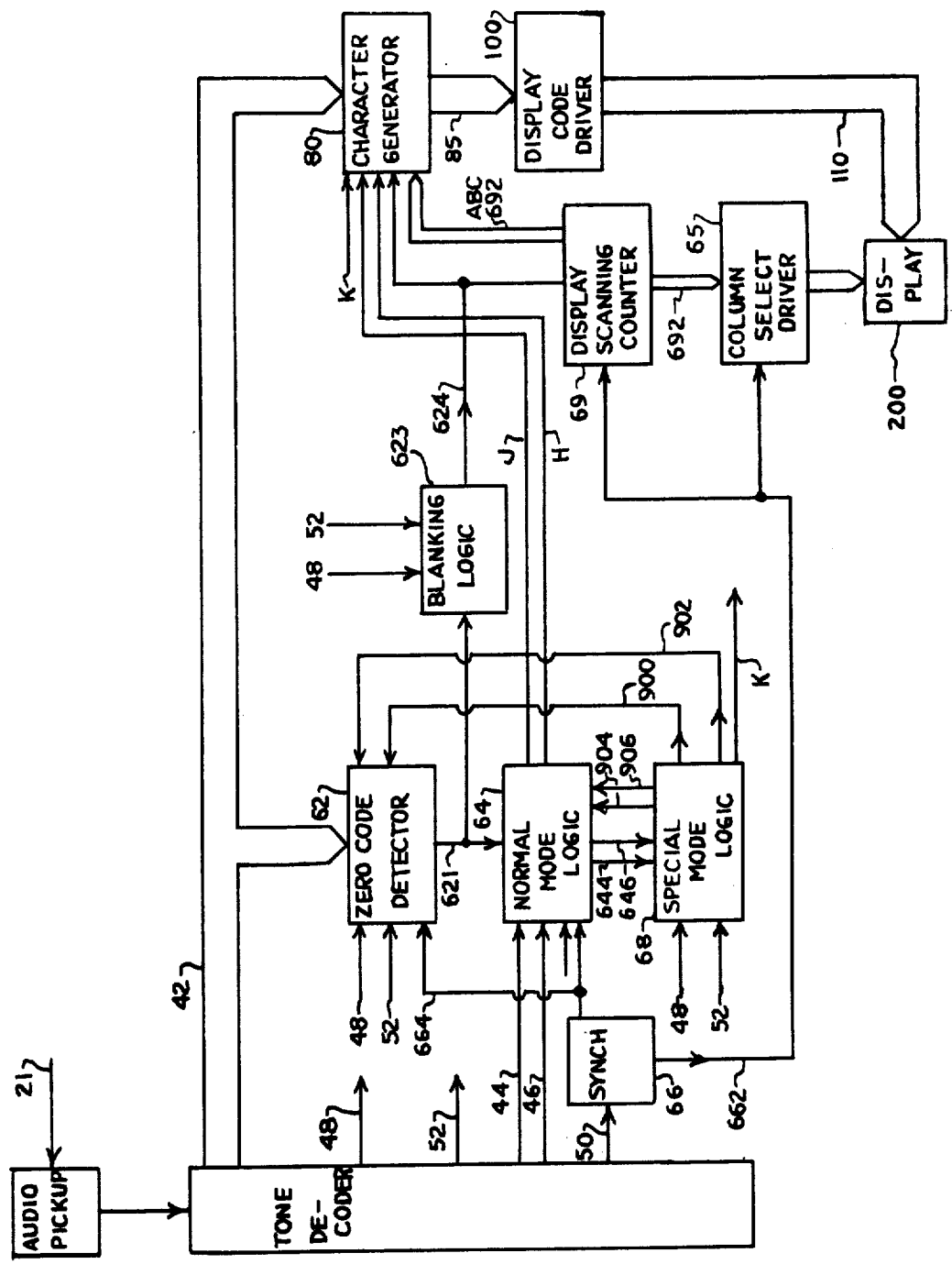
FIG. 2 is a block diagram of apparatus made in accordance with the invention for implementing the coding scheme depicted in FIG. 1B.
Figure 3B:
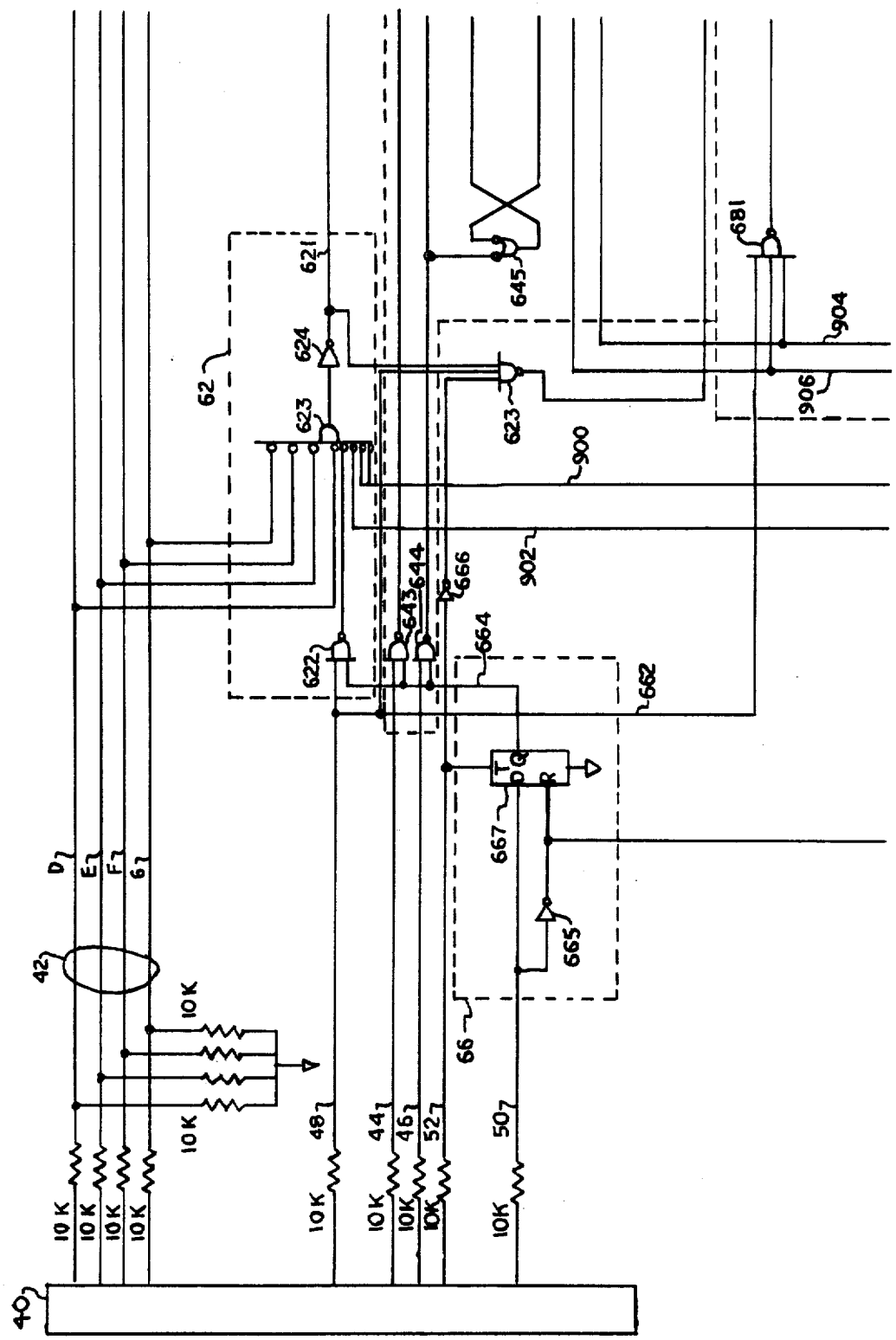
FIGS. 3 to 3E are detailed schematic diagrams of the apparatus shown in FIG. 2.
Figure 3C:
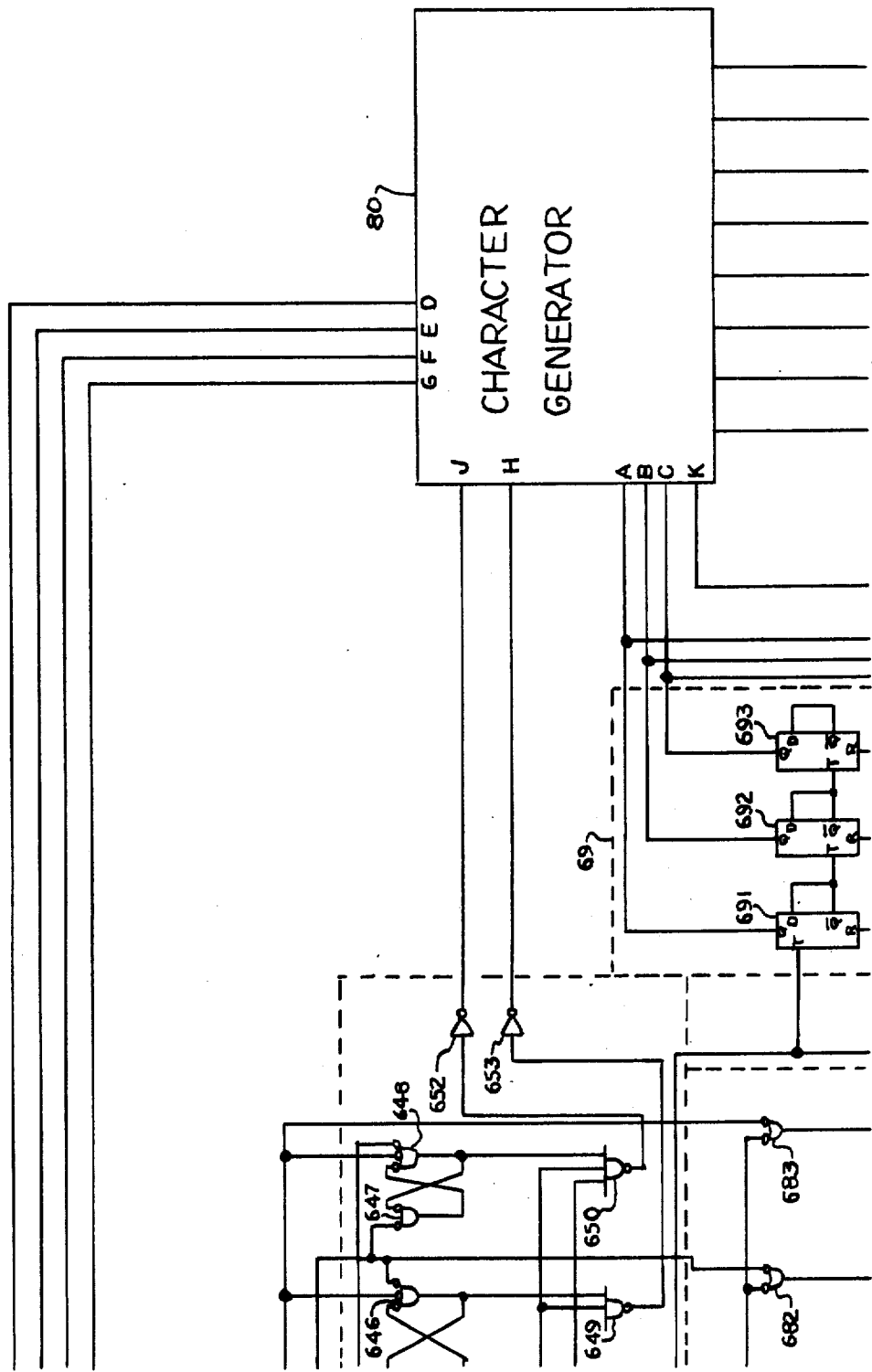
Figure 3D:
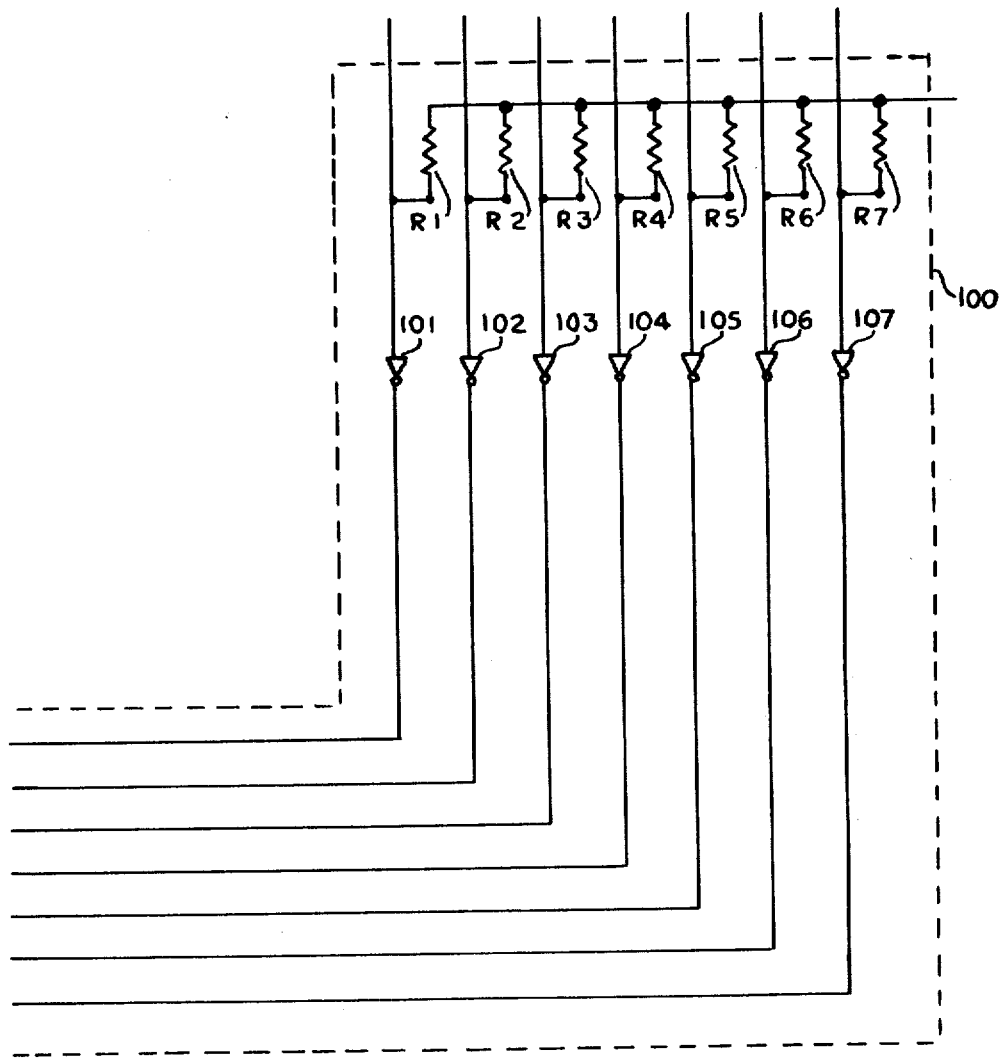
Figure 3E:
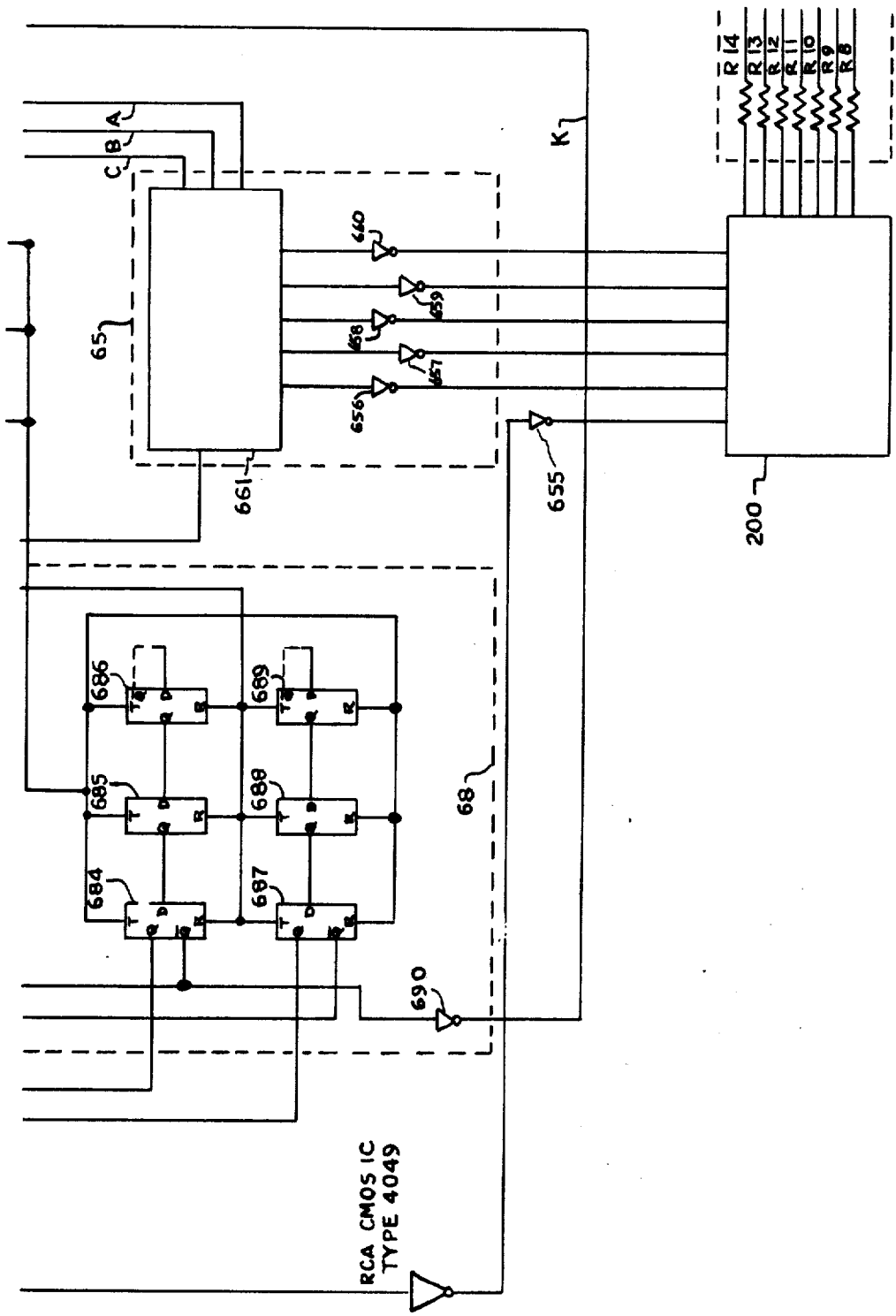

Referring to FIG. 1, there are shown standard 12 and 16 push-button telephone keyboards and a preferred coding scheme. The CHARACTER columns of FIG. 1b identify a selected alphabetic character, number or symbol to be transmitted and the ACTUATION SEQUENCE columns identify pushbuttons to be actuated by the typical symbols appearing thereon and their actuation sequence.

Referring to FIG. 1a, the normal letter groupings appearing on the pushbuttons are in groups of three and positioned horizontally from left to right. There are also three lower pushbuttons, *, 0, and #, without alphabetic markings and positioned horizontally from left to right. The preferred embodiment takes advantage of the existing relative position of pushbuttons *, 0, and # by utilizing them as prefix control keys to select an alphabetic character having the same relative position from among three indicated characters appearing on a subsequently actuated pushbutton. Referring to the pushbutton having the digit 2 and the letters ABC appearing thereon and referring to FIG. 1b, a user selects the letter A by actuating as a prefix control key the pushbutton * which has the same relative position as A within the grouping ABC, namely, the left letter, followed by actuation of the pushbutton 2 having the alphabetic grouping ABC. A user similarly selects the letter B which is the middle letter of the grouping ABC by actuating as a middle prefix control key the zero pushbutton 0 followed by actuating pushbutton 2. Similarly, the right letter of the group ABC is selected by actuating as a right prefix control key pushbutton # followed by actuation of pushbutton 2.

The letters Q and Z and the period symbol are assigned to pushbutton 1 as shown in FIG. 1b. The coding scheme therefore requires no more than two pushbutton strokes for any alphabetic character and the most commonly used punctuation symbol used in normal conversation.

An alternate preferred encoding scheme including actuation of the alphabetic pushbutton followed by actuation of the non-alphabetic control pushbuttons *, 0, and #. The actuation sequence for ABCD would be, for example, 2*, 20, 2#, 3*.

A typical conversational message, for example, might be "PLEASE CALL JOHN AT 408-765-4321.". One actuation sequence accepted by the preferred code shown in FIG. 1b for this message is depicted in FIG. 1c.

A user separates words, for example, by pausing between words, by insertion of a period after transmission of a long word, by flashing the last letter through multiple actuation of the alphabetic pushbutton corresponding to the last letter of the word, or the like.

In operation, a user achieves a high rate of transmission by using two hands. A right-handed person, for example, utilizes three fingers of his left hand to actuate pushbuttons *, 0, and # and utilizes the fingers of his right hand for actuation of the remaining pushbuttons. It can be recognized from FIG. 1b that physical tactile effort is thereby equally divided between the two hands for normal conversation and only a single actuation of a pushbutton by each hand is needed to transmit any letter or a period. Additionally, prefix control functions *, 0, and # are divided among three fingers of the left hand, thereby lessening fatigue of a selected finger as compared, for example, to control coding schemes requiring multiple actuation of a control key for alphabetic character transmission.

Referring to FIG. 1c and control sequences 20 and 21, a transition from the normal alphabetic mode to a numeric mode is accomplished by actuating the number pushbutton, #, three times. Once in the numeric mode, a user actuates pushbuttons having a digit marking corresponding to the number desired. A user transfers back to the normal alphabetic mode by a single actuation of the * pushbutton as shown by sequence 22.

Referring to FIG. 1c and control sequence 24, a transition from the normal alphabetic mode to a symbol mode is accomplished by actuating the * pushbutton three times. For the code depicted in FIG. 1b a user actuates the pushbutton marked with the 1 digit to send a hyphen symbol. A user transfers out of the symbol mode by a single actuation of the # pushbutton.

Referring to FIG. 1d, a second actuation sequence for the conversational message "PLEASE CALL JOHN AT 408-765-4321." requiring fewer pushbutton actuations is shown. Once the left, middle or right letter has been selected by actuation of a *, 0, or # pushbutton, other letters of the same group can be transmitted without a requirement for again pushing the same prefix pushbutton, as illustrated by sequences 27, 28 and 29 in FIG. 1d. For ease of remembering the operating procedure, the sequence of FIG. 1c is preferable and for transmission efficiency and rapid communication by experienced users, the procedure of FIG. 1d is preferable. An easy procedure for experienced and inexperienced users for repeating a letter is illustrated by sequence 27 where a user merely actuates the alphabetic pushbutton a plurality of times corresponding to the number of repetitive sequential occurrences of the letter.

Referring to FIG. 2, a block diagram of a communicator made in accordance with the invention and implementing the encoding scheme described hereinbefore is shown. Standard pushbutton telephone tones 21 from, for example, a pushbutton telephone earpiece or the like are detected by audio pickup 30 and applied to a tone decoder 40. Tone decoder 40 is, for example, a Tone Technology Corporation type TT800B, or the like. Decoder 40 produces a digital signal 42 on four BCD data lines as a binary coded decimal number corresponding to an actuated pushbutton having a numeric digit marked thereon. Asterisk signal 44 is produced in response to actuation of the * pushbutton and actuation of the # pushbutton produces number signal 46. A BCD data identifier signal 48 is produced simultaneously with digital signal 42 to indicate presence of incoming BCD data. A tone present signal 50 is produced when there is any tone input 21. A clock signal 52 is also produced.

A zero code detector 62 is coupled to receive a digital signal 42, the BCD data identifier signal 48, the clock signal 52 and the enable signal 664, a special function signal 902 and a number signal 900 in order to produce a middle letter select signal 621 in response to receiving standard tones 21 corresponding to actuation of a zero key. The zero key is unique in the preferred coding scheme in that it is used to select the middle letter of a grouping of letters upon an actuated alphabetic key and it is also used as the number zero if a user is in the number mode.

Normal mode logic 64 is coupled to receive the middle letter select signal 621, the asterisk signal 44, the number signal 46 for producing a left letter select signal 644, a right letter select signal 646, and code selection address bits H and J. The normal mode logic 64 looks at the asterisk signal 44, the number signal 46, and the middle letter select signal 621 to identify whether the asterisk key, the zero key, or the number key has been actuated and produces code selection address bits H and J according to the actuated key. For example, if tone signals 21 were received corresponding to actuation of the asterisk key, the code selection address bits H and J would be respectively 10. They would stay in the state until another one of these keys is pushed, the asterisk, the number, or the zero key. If, for example, a number key is then actuated and the tone for that key is received, the normal mode logic 64 would change code selection address bits H and J respectively to be 01. Code selection address bits H and J are used as the highest order address lines for a character generator 80. Therefore, in effect, the normal mode logic 64 selects either the left, the middle, or the right positioned letter of all letters marked on the alphabetic pushbuttons.

Special mode logic 68 is coupled to receive left letter select signal 644 and right letter select signal 646 from the normal mode logic 64, the BCD data identification signal 48, and the clock signal 52 from the tone decoder 40 for producing a number signal 900, a special function signal 902, and a code selection address bit K. The special mode logic 68 determines if a user is in the number mode or the special symbols mode and requires that the corresponding key that brings these states into being is pressed three times. The special mode logic 68 can be, for example, a three-state shift register for each of the two modes. If, for example, the number key is pushed it makes the first of three shift stages shift into a one logic state. A second push of the number key puts the second flip-flop of the shift register into the one logic state. A third push of the same key puts a third flip-flop of the shift register into the one logic state and the output of the third flip-flop identifies that the device is in the number mode. If another key is pushed before the one logic state is shifted all the way into the third stage, the special mode logic is reset. The special mode logic 68 assures that a selected pushbutton is pushed three times in succession in order to get into the special mode and produce a logic one state for the code selection address bit K. Once a user is in the special mode, a user can push selected pushbutton corresponding to desired characters and get special characters until he gets out of the mode by pushing a pushbutton corresponding to an opposite mode. For example, if a user pushes the asterisk pushbutton to get into the special character mode, a user would have to push the number pushbutton to get into the normal mode again.

A display scanning counter 69 is coupled to receive a reset signal on the reset line 662 from the synchronizer 66 and the blanking signal 624 from blanking logic 623 for generating a three-bit address 692. The three-bit address 692 represents the three lowest order bits of a read only memory address within character generator 80. Address bits 692 also correspond to vertical lines within a display 200. The display scanning counter 69 continually scans from count zero to count seven and back again and generates binary codes corresponding to the counts on three address lines. The address bits 692 are applied to the character generator 80 and to a column select driver 65. The column select driver 65 produces driving signals and applies them to the display 200.

The character generator 80 is coupled to receive the digital signal 42 from the tone decoder 40, the code selection address bits H and J from the normal mode logic 644, the code selection address bit K from the special mode logic 68, and the three-bit address 692 from the display scanning counter 69 for selecting by the code represented by the combination of these signals a particular matrix pattern corresponding to a desired character or symbol and producing a character generator output signal 85 corresponding to the desired character or symbol. A display code driver 100 is coupled to receive the character generator output 85 for producing a display driving signal 110 to the display 200.

The synchronizer 66 is coupled to receive the tone presence signal 50 and produces on reset line 662 and signal which synchronizes the tone presence signal with the clock signal for internal timing. The tone presence signal 50 thereby resets the display scanning counter 69 and column select driver 65 by means of reset line 662. The blanking logic 623 turns the display 200 off in between characters at very short intervals as the display 200 is changing from one line to another.

Referring to FIG. 3, a detailed schematic diagram of an actual working embodiment implementing the preferred encoding scheme is shown. The various logic elements, read-only memories, and the display employed in the circuit of FIG. 3 are conventional in nature. Thus, for the sake of brevity and to facilitate understanding of the inventive concepts, each of the individual circuits is not described in detail. In the actual working embodiment depicted in FIG. 3, the various components were of the type of had the values listed in the following table:

| Component | Type |
|---|---|
| Tone decoder 40 | Tone Technology TT800B |
| *Zero code detector 62* | |
| NAND Gate 622 | RCA CMOSIC Type 4011 |
| NOR Gate 623 | RCA CMOSIC Type 4078 |
| Inverter 624 | RCA CMOSIC Type 4049 |
| *Normal mode logic 64* | |
| NAND Gate 643, 644 | RCA CMOSIC Type 4011 |
| Logic elements 645 and 647 | RCA CMOSIC Type 4011 |
| Logic elements 646 and 648 | RCA CMOSIC Type 4023 |
| Logic elements 649 and 650 | RCA CMOSIC Type 4023 |
| Logic elements 652 and 653 | RCA CMOSIC Type 4049 |
| *Special mode logic 68* | |
| NAND Gate 681 | RCA CMOSIC Type 4023 |
| Logic elements 682 and 683 | RCA CMOSIC Type 4011 |
| Flip-flops 684, 685, 686, 687 688, and 689 | RCA CMOSIC Type 4013 |
| Inverter 690 | RCA CMOSIC Type 4049 |
| *Synchronizer 66* | |
| Inverters 665 and 666 | RCA CMOSIC Type 4049 |
| Flip-flop 667 | RCA CMOSIC Type 4013 |
| *Blanking logic 623* | |
| NAND Gate 623 | RCA CMOSIC Type 4023 |
| *Display scanning counter* | |
| Flip-flops 691, 692 and 693 | RCA CMOSIC Type 4013 |
| *Column select driver 65* | |
| Inverters 655, 656, 657, 658, 659, 660 | RCA CMOSIC Type 4049 |
| BCD/10 line decoder 661 | National Semiconductor Type 74C42 |
| Display 200 | Litronix Data-Lit 57/MAN-2 5×7 dot matrix array true alpha numeric |
| *Character generator 80* | |
| Read-only memory 802 | Type 3604/6 |
| Read-only memory 804 | Type 6304/4 |
| *Display code driver* | |
| Resistors R1 through R7 | 10,000 ohms |

| Component | Type |
| --- | --- |
| Inverters 101 through 107 | RCA CMOSIC Type 4049 |
| Resistors 8 through 14 | 470 ohm |

Referring again to FIG. 3 and the detailed schematic of a preferred embodiment for the special mode logic 68, the special mode logic 68 is easily modified so that a user stays in a special mode only for one character and then returns to the normal mode. This is done, for example, in the symbol mode by coupling the D and Q̄ terminals of flip-flop 689 together, as shown by the dotted line associated with flip-flop 689. The special mode logic 68 may be similarly modified so that a user when in the number mode will be in the number mode for only one character and then automatically return to the normal mode by coupling the D and Q̄ terminals of flip-flop 686 together as shown by the dotted line associated with flip-flop 686. If a user, for example, actuates an asterisk key to get into the symbols mode in accordance with the coding scheme, each time the asterisk is pushed, the first flip-flop 686 changes from one to zero, then from zero to one, and then from one to zero again, and so forth, so that by the time the one bit has shifted to flip-flop 684 and puts the system in a special mode, the logic states in the three flip-flops 686, 685, and 684 are one-zero-one. The next shift of any actuated pushbutton will put a zero logic state into the third stage 684 and a user will then be out of the symbol mode. If a user actuates a key that is not the asterisk pushbutton, as for example, in the case of the number pushbutton, all flip-flops will again be reset. This allows a simple way of getting out of a symbol mode or number mode after the first character is transmitted. A user is still required to actuate a selected pushbutton three times in order to get into either a special mode or number mode and protection is provided against a user accidentally thinking he is actually transmitting numbers or symbols.

Referring to FIG. 4, there is shown a table illustrating the correspondence between a mode select function performed by the logic in response to actuation of an asterisk, zero, or number pushbutton and the corresponding code selection address bits produced by the normal mode logic 64 and the special mode logic 68.

An alternate embodiment of the invention for use with the standard 16 pushbutton telephone utilizes the nonalphabetic pushbuttons positioned in the right column of the pushbutton depicted in FIG. 1a and their respective relative positions as prefix or postfix selection keys in a manner analogous to use of the *, O, and # pushbuttons described hereinabove. The alphabetic characters A, B, C are sent for example by pushbutton actuations I2, II2, III2 or 2I, 2II, and 2III. A user positions, for example, the fingers of his right hand on pushbuttons I, II, III, IV and his left hand above the alphabetic pushbuttons. Any alphabetic character is thereby sent in response to two pushbutton actuations. Tactile physical effort is divided between both hands and the code is easily remembered.

What is claimed is:

1. Apparatus for use in receiving messages transmitted by pushbutton tone signaling means having a plurality of alphabetic pushbutton and a plurality of non-alphabetic pushbuttons, the alphabetic pushbuttons each having a plurality of alphabetic character markings and the alphabetic and non-alphabetic pushbuttons each generating distinct tone signals in response to actuation of a selected pushbutton, comprising:

decoding means coupled to receive the distinct tone signals for producing distinct electrical signals corresponding to actuation of the selected pushbutton;

means coupled to receive the distinct electrical signals for producing an alphabetic character address signal in response to receiving a first signal corresponding to actuation of a non-alphabetic pushbutton followed by a second signal corresponding to actuation of an alphabetic pushbutton; and display means coupled to receive the alphabetic character address signal for producing a visual display of an alphabetic character corresponding to a character marking of the plurality of alphabetic character markings of the actuated alphabetic pushbutton, the character marking having a similar relative position within the plurality of alphabetic character markings of the actuated alphabetic pushbutton as compared to the relative position of the actuated non-alphabetic pushbutton with respect to positions of said plurality of non-alphabetic pushbuttons on the pushbutton tone signaling means.

2. Apparatus as in claim 1 wherein a plurality of said alphabetic and non-alphabetic pushbuttons each having a numeric digit marking and comprising:

means coupled to receive said distinct electrical signals for producing a numeric character address signal in response to receiving a plurality of signals corresponding to multiple actuation of a selected in non-alphabetic pushbutton followed by a signal corresponding to actuation of a pushbutton having a numeric marking; and means coupled to receive the numeric character address signal for producing a visual display of a numeric character corresponding to the numeric digit marking of the actuated pushbutton having a numeric marking.

3. Apparatus as in claim 1 wherein a plurality of said alphabetic and non-alphabetic pushbuttons each have a numeric digit marking comprising:

means coupled to receive said distinct electrical signals for producing a symbol address signal in response to receiving a plurality of signals corresponding to multiple actuation of a selected non-alphabetic pushbutton followed by a signal corresponding to actuation of a pushbutton having a numeric marking; and means coupled to receive the symbol address signal for producing a visual display of a symbol.

4. Apparatus as in claim 1 wherein alphabetic and non-alphabetic pushbuttons are positioned in a matrix having columns and rows of pushbuttons, a selected row of pushbuttons are non-alphabetic, and the means for producing an alphabetic characters address signal responds to said first signals corresponding only to actuation of non-alphabetic pushbuttons in said selected row.

5. Apparatus as in claim 4 wherein there are three non-alphabetic pushbuttons within the selected row relatively positioned as left, middle and right with respect to each other on the pushbutton telephone and the plurality of character markings on the alphabetic pushbuttons comprise three alphabetic characters positioned horizontally and relatively positioned as left, middle, and right.

6. Apparatus as in claim 4 wherein said selected row is the bottom row of the matrix.

7. Apparatus as in claim 1 wherein alphabetic and non-alphabetic pushbuttons are positioned in a matrix having columns and rows of pushbuttons, a selected column of pushbuttons are non-alphabetic and the means for producing an alphabetic character address signal responds to said first signals corresponding only to actuation of non-alphabetic pushbuttons in said selected column.

8. Apparatus for use in receiving messages transmitted by pushbutton tone signaling means having a plurality of alphabetic pushbuttons and a plurality of non-alphabetic pushbuttons, the alphabetic pushbuttons each having a plurality of alphabetic character markings and the alphabetic and non-alphabetic pushbuttons each generating distinct tone signals in response to actuation of a selected pushbutton comprising:

decoding means coupled to receive the distinct tone signals for producing distinct electrical signals corresponding to actuation of the selected pushbutton;

means coupled to receive the distinct electrical signals for producing an alphabetic character address signal in response to receiving a first signal corresponding to actuation of a alphabetic pusbutton followed by a second signal corresponding to actuation of a non-alphabetic pushbutton, and display means coupled to receive the alphabetic character address signal for producing a visual display of an alphabetic character corresponding to a character marking of the plurality of alphabetic character markings of the actuated alphabetic pushbutton, the character marking having a similar relative position within the plurality of alphabetic character markings of the actuated alphabetic pushbutton as compared to the relative position of the actuated non-alphabetic pushbutton with respect to positions of said plurality of non-alphabetic pushbuttons on the pushbutton tone signaling means.

9. Apparatus as in claim 8 wherein a plurality of said alphabetic and non-alphabetic pushbuttons each have a numeric digit marking and comprising:

means coupled to receive said distinct electrical signals for producing a numeric character address signal in response to receiving a plurality of signals corresponding to multiple actuation of a selected non-alphabetic pushbutton followed by a signal corresponding to actuation of a pushbutton having a numeric marking; and means coupled to receive the numeric character address signal for producing a visual display of a numeric character corresponding to the numeric digit marking of the actuated pushbutton having a numeric marking.

10. Apparatus as in claim 8 wherein a plurality of said alphabetic and non-alphabetic pushbutton each have a numeric digit marking comprising:

means coupled to receive said distinct electrical signals for producing a symbol address signal in response to receiving a plurality of signals corresponding to multiple actuation of a selected non-alphabetic pushbutton and a signal corresponding to actuation of a pushbutton having a numeric marking; and means coupled to receive the symbol address signal for producing a visual display of a symbol.

11. Apparatus as in claim 8 wherein alphabetic and non-alphabetic pushbuttons are positioned in a matrix having columns and rows of pushbuttons, a selected row of pushbuttons are non-alphabetic, and the means for producing an alphabetic character address signal responds to said second signals corresponding only to actuation of non-alphabetic pushbuttons in said selected row.

12. Apparatus as in claim 11 wherein there are three non-alphabetic pushbuttons within the selected row relatively positioned as left, middle and right with respect to each other on the pushbutton telephone and the plurality of character markings on the alphabetic pushbuttons comprise three alphabetic characters positioned horizontally and relatively positioned as left, middle and right.

13. Apparatus as in claim 11 wherein said selected row is the bottom row of the matrix.

14. Apparatus as in claim 8 wherein alphabetic and non-alphabetic pushbuttons are positioned in a matrix having columns and rows of pushbuttons, a selected column of pushbuttons are non-alphabetic and the means for producing an alphabetic character address signal responds to said first signals corresponding only to actuation of non-alphabetic pushbuttons in said selected column.

* * * * *